United States Patent
Talledo et al.

(10) Patent No.: US 11,270,894 B2
(45) Date of Patent: Mar. 8, 2022

(54) MANUFACTURING METHOD FOR SEMICONDUCTOR PACKAGE WITH CANTILEVER PADS

(71) Applicant: STMicroelectronics, Inc., Calamba (PH)

(72) Inventors: Jefferson Talledo, Calamba (PH); Godfrey Dimayuga, San Pablo (PH)

(73) Assignee: STMICROELECTRONICS, INC., Calamba (PH)

( * ) Notice: Subject to any disclaimer, the term of this patent is extended or adjusted under 35 U.S.C. 154(b) by 462 days.

(21) Appl. No.: 15/876,046

(22) Filed: Jan. 19, 2018

(65) Prior Publication Data

US 2018/0144952 A1   May 24, 2018

Related U.S. Application Data

(62) Division of application No. 14/582,581, filed on Dec. 24, 2014, now Pat. No. 9,899,236.

(51) Int. Cl.
*H01L 21/48* (2006.01)
*H05K 3/32* (2006.01)
(Continued)

(52) U.S. Cl.
CPC .... *H01L 21/4857* (2013.01); *H01L 23/49811* (2013.01); *H01L 23/49822* (2013.01); *H05K 3/284* (2013.01); *G01P 15/08* (2013.01); *G01P 15/0802* (2013.01); *H01L 23/3114* (2013.01); *H01L 23/49816* (2013.01); *H01L 2224/32225* (2013.01); *H01L 2224/48091* (2013.01); *H01L 2224/48227* (2013.01); *H01L 2224/48228* (2013.01); *H01L 2224/73265* (2013.01);
(Continued)

(58) Field of Classification Search
CPC .......... H01L 21/4857; H01L 23/49811; H01L 23/49822; H01L 23/49816; H01L 2224/32225; H01L 2224/48091; H01L 2224/48227; H01L 2224/48228; H01L 2224/73265; H01L 2924/00012; H01L 2924/00014; H01L 2924/0002; H01L 2924/06; H01L 2924/15311; H01L 2924/15183; H01L 2924/181; H01L 23/3114; H05K 3/32; H05K 3/323; H05K 3/341; H05K 3/284; H05K 2203/041; H05K 2203/049; G01P 15/08; G01P 15/0802; Y10T 29/49146; Y10T 29/49171
See application file for complete search history.

(56) References Cited

U.S. PATENT DOCUMENTS 6,064,576 A    5/2000  Edwards et al.
6,114,864 A    9/2000  Soejima et al.
(Continued)

FOREIGN PATENT DOCUMENTS

JP    2010177300 A  *  8/2010

*Primary Examiner* — A. Dexter Tugbang
(74) *Attorney, Agent, or Firm* — Seed Intellectual Property Law Group LLP

(57) ABSTRACT

One or more embodiments are directed to methods of forming one or more cantilever pads for semiconductor packages. In one embodiment a recess is formed in a substrate of the package facing the cantilever pad. The cantilever pad includes a conductive pad on which a conductive ball is formed. The cantilever pad is configured to absorb stresses acting on the package.

19 Claims, 8 Drawing Sheets

(51) Int. Cl.
*H01L 23/498* (2006.01)
*H05K 3/28* (2006.01)
*G01P 15/08* (2006.01)
*H05K 3/34* (2006.01)
*H01L 23/31* (2006.01)

(52) U.S. Cl.
CPC .............. *H01L 2924/0002* (2013.01); *H01L 2924/15183* (2013.01); *H01L 2924/15311* (2013.01); *H01L 2924/181* (2013.01); *H05K 3/32* (2013.01); *H05K 3/323* (2013.01); *H05K 3/341* (2013.01); *H05K 2203/041* (2013.01); *H05K 2203/049* (2013.01); *Y10T 29/49146* (2015.01); *Y10T 29/49171* (2015.01)

(56) References Cited

U.S. PATENT DOCUMENTS

| | | | |
|---|---|---|---|
| 6,521,970 B1* | 2/2003 | Takiar | H01L 23/3114 257/522 |
| 6,534,391 B1* | 3/2003 | Huemoeller | H05K 3/284 257/E23.067 |
| 6,617,191 B1* | 9/2003 | Iwata | G01P 15/0802 257/E21.216 |
| 6,759,261 B2 | 7/2004 | Shimokohbe et al. | |
| 6,922,069 B2 | 7/2005 | Jun | |
| 6,992,399 B2 | 1/2006 | Stewart | |
| 7,002,225 B2 | 2/2006 | Stewart | |
| 7,759,161 B2 | 7/2010 | Tanaka et al. | |
| 8,610,264 B2* | 12/2013 | Oganesian | H01L 2924/00014 257/724 |
| 2002/0190396 A1 | 12/2002 | Brand | |
| 2003/0054590 A1 | 3/2003 | Murayama et al. | |
| 2005/0172717 A1* | 8/2005 | Wu | G01P 15/0802 73/514.34 |
| 2007/0114623 A1* | 5/2007 | Kuisma | G01P 15/0802 257/415 |
| 2008/0023814 A1 | 1/2008 | Yang | |
| 2009/0115073 A1* | 5/2009 | Sunohara | H01L 23/49811 257/778 |
| 2009/0241670 A1* | 10/2009 | Nomura | G01P 15/0802 73/514.33 |
| 2009/0321110 A1* | 12/2009 | Huang | H05K 3/323 174/254 |
| 2016/0096724 A1 | 4/2016 | Dawson et al. | |

* cited by examiner

MANUFACTURING METHOD FOR SEMICONDUCTOR PACKAGE WITH CANTILEVER PADS

BACKGROUND

Technical Field

Embodiments of the present disclosure are directed to semiconductor packages and methods of making same.

Description of the Related Art

Reliability of semiconductor packages is of significant importance. Although various issues cause reliability problems in semiconductor packages, one known reason for reliability issues is that packages and the boards, onto which the package are mounted, are formed of various types of materials, each having different coefficients of thermal expansion (CTE). During use, heat is generated, and due to differing CTEs, stress may be introduced into the package and/or the board, which can cause cracks, for instance, in solder joints that couple the semiconductor package to a printed circuit board (PCB), thereby affecting board level reliability of the package by disrupting the electrical coupling between the package and the PCB.

BRIEF SUMMARY

One or more embodiments are directed to semiconductor packages with one or more cantilever pads and methods of making same. In one embodiment a recess is located in a substrate of the package facing the cantilever pad. The cantilever pad includes a conductive pad on which a conductive ball is formed. The cantilever pad is configured to absorb stresses acting on the package. For instance, the cantilever pad may be configured to flex into the recess and/or flex outwardly therefrom. In that regard, the cantilever pad may respond readily in response to stress that is acting on various materials of the semiconductor package. For instance, during operation, the cantilever pad may be configured to flex inward, toward the recess, and/or outward, away from the recess, in response to expansion of one or more materials caused by various materials having differing CTEs and expanding at differing rates. Thus, the likelihood of cracks being formed in electrical structures of the package or a PCB coupled to the package is reduced. In one embodiment, the cantilever pad may prevent or reduce the likelihood of cracks occurring in conductive balls that electrically couple the package to the PCB.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

It will be appreciated that, although specific embodiments of the present disclosure are described herein for purposes of illustration, various modifications may be made without departing from the spirit and scope of the present disclosure.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Figure 1A:
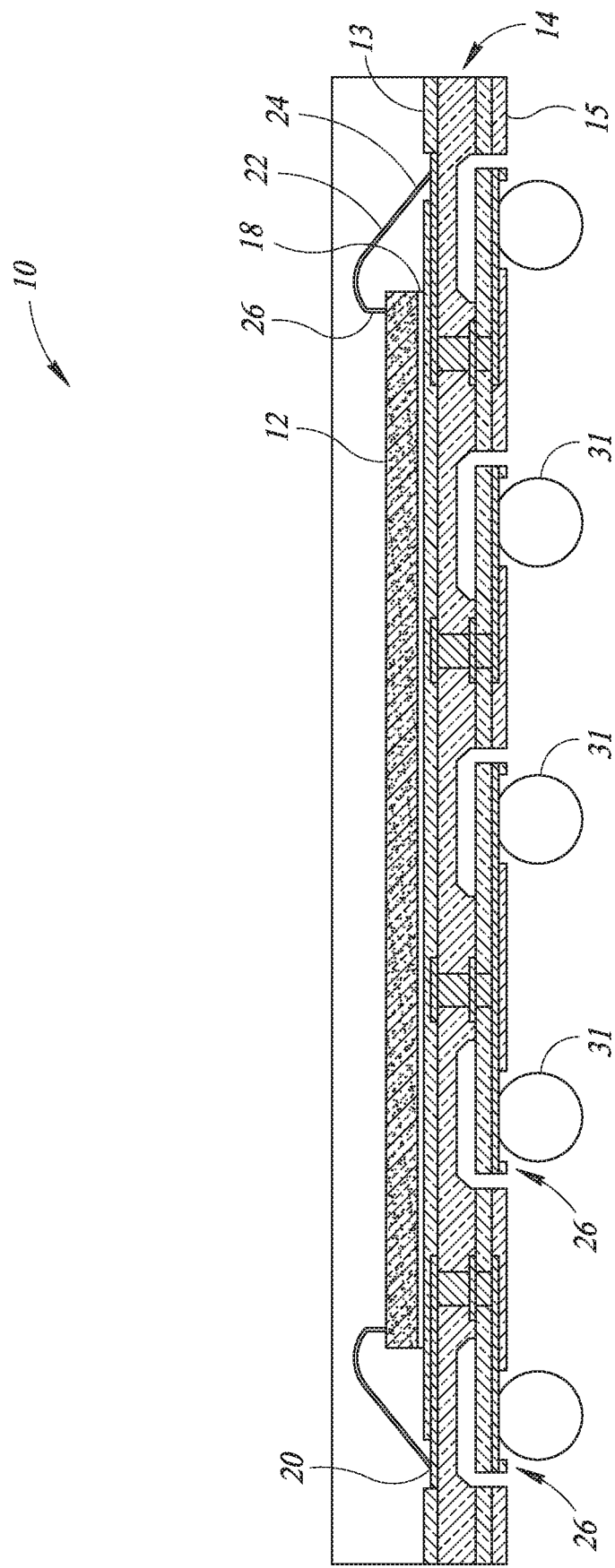
FIG. 1A is a cross-sectional view of a semiconductor package in accordance with one embodiment of the disclosure.
Figure 1B:
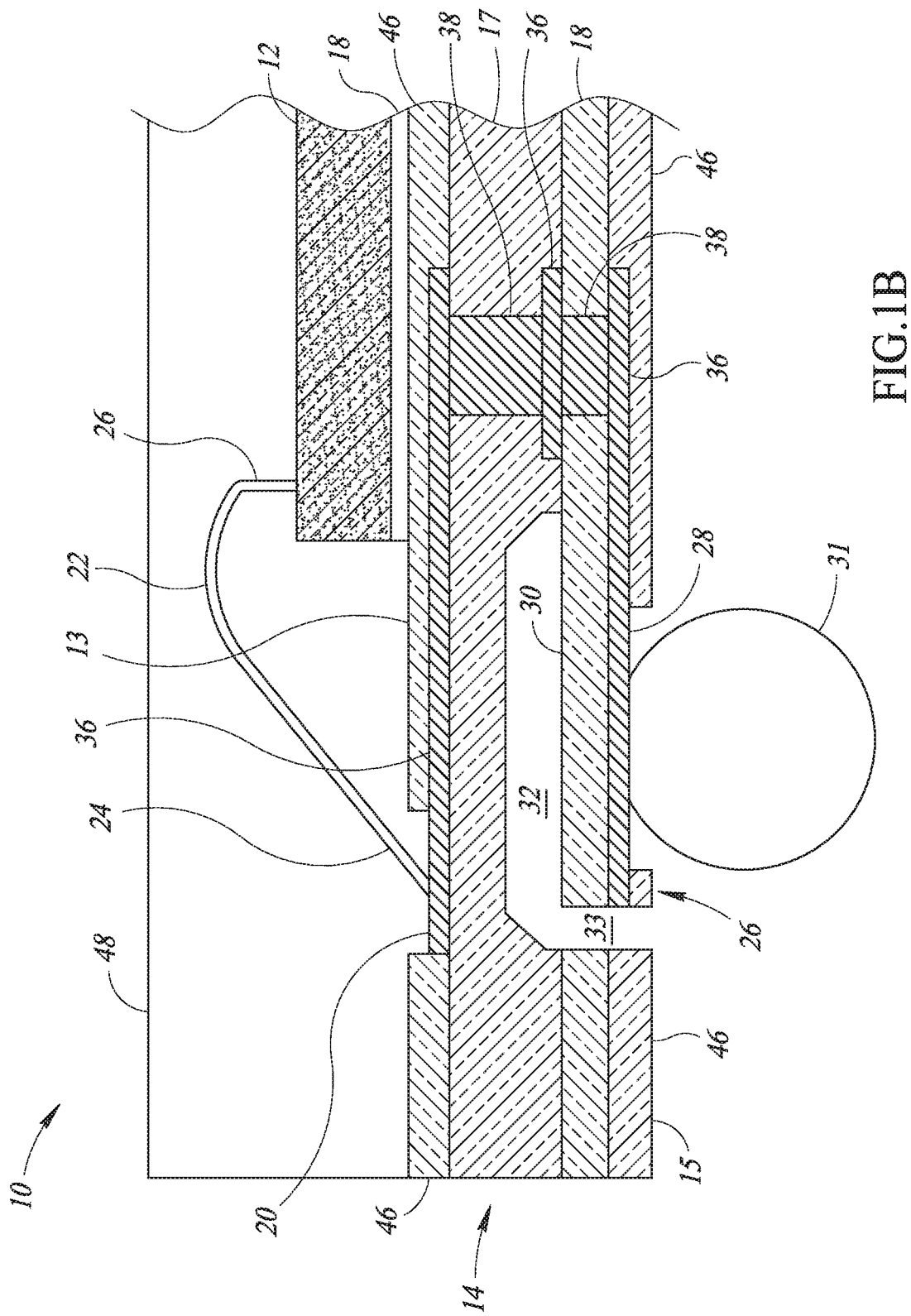
FIG. 1B is a close-up cross-sectional view of the package of FIG. 1.

FIG. 1A shows a cross-sectional view of a package 10 in accordance with one embodiment of the disclosure. FIG. 1B shows a close-up view of a portion of FIG. 1A. The package 10 includes a semiconductor die 12 on an upper surface 13 of a substrate 14. The semiconductor die 12 includes electrical structures of an electrical device, such as an integrated circuit.

The substrate 14 has a lower surface 15 opposite the upper surface 13 and includes one or more conductive and insulative layers. In the illustrated embodiment, the substrate 14 includes first and second layers 17, 19 of insulative material; however, the substrate 14 may include any number of insulative layers. The insulative layers may include any insulative material including ceramic, glass, polymer, or any other suitable insulative material. The one or more conductive layers may be any conductive material, such as a metal material. In one embodiment, the conductive layers are copper.

The semiconductor die 12 is coupled to the upper surface 13 of the substrate 14 by an adhesive material 18. The adhesive material 18 may be any adhesive material 18 that bonds the semiconductor die 12 to the upper surface 13 of the substrate 14, such as paste, glue, epoxy, double-sided tape, or any other suitable material.

The upper surface 13 of the substrate 14 includes a plurality of conductive fingers 20 located near one or more edges of the semiconductor die 12. Although only two conductive fingers 20 are shown, it is to be appreciated that any number of conductive fingers 20 may be provided, including just one. In some embodiments, a plurality of conductive fingers 20 is located on each side of the semiconductor die 12. In general, the conductive fingers 20 are electrically isolated from each other, however, two or more may be coupled together by one or more conductive traces.

The semiconductor die 12 is electrically coupled to the conductive fingers 20. In particular, the electrical device of the semiconductor die 12 is coupled to the conductive fingers 20 by conductive wires 22. More particularly, a first end 24 of the conductive wire 22 is coupled to a bond pad of the semiconductor die 12, which may be coupled to various electrical components of the electrical device, and a second end 26 of the conductive wire is coupled to the conductive finger. In another embodiment, the electrical device of the semiconductor die 12 is coupled to the conductive fingers 20 by flip chip arrangement as is well known in the art. In that regard, the conductive fingers 20 would be located under the semiconductor die 12 and coupled to the bond pads of the semiconductor die 12 by conductive balls.

Figure 2:
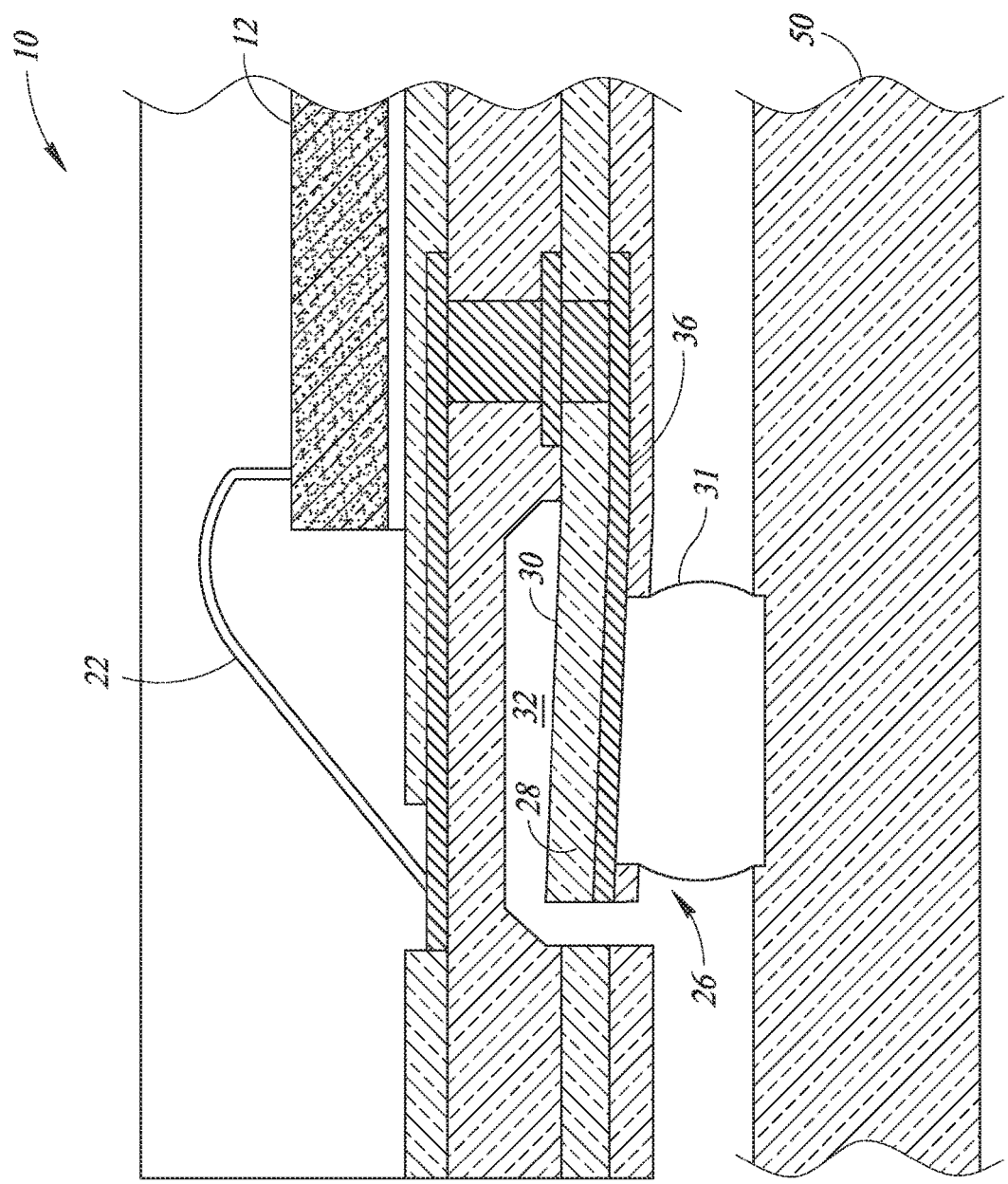
FIG. 2 is a close-up cross sectional view of the package of FIG. 1 coupled to another device.

The lower surface 15 of the substrate 14 includes a plurality of cantilever pads 26. As best shown in FIG. 1B, the cantilever pads 26 include a conductive pad 28 that is supported by a substrate support portion 30. On the conductive pad 28 of the cantilever pad 26 is a conductive ball 31, such as a solder ball, that is configured to couple the package 10 to another substrate or board, such as a PCB 50 (FIG. 2).

Figure 1C:
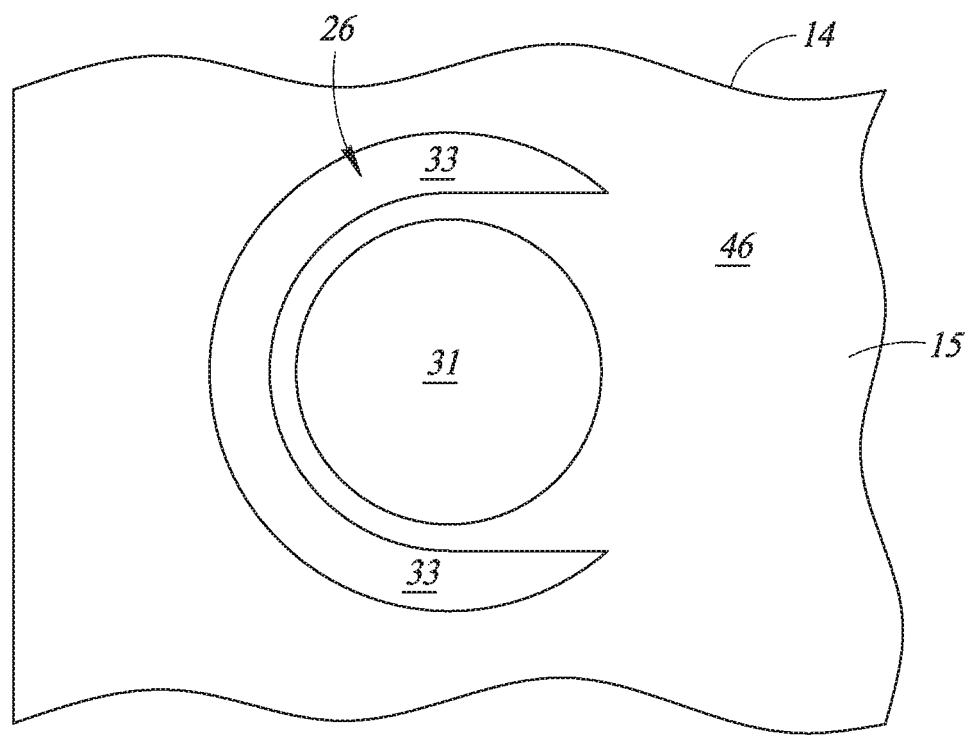
FIG. 1C is a close-up bottom view of the close-up view of FIG. 1B.

The cantilever pads 26 are cantilevered by recesses 32 located above the cantilever pads 26 and by through openings 33 in the substrate 14 along three sides of the cantilever pads 26. In particular, the recesses 32 are located in the first layer 17 and the through openings 33 are located the second layer 19 in communication with the recesses 32. As best shown in FIG. 1C, through openings 33 extend from one end and along side surfaces of the cantilever pads 26 forming a C-shape in planar view. The through openings 33, in planar view, may be any shape that forms a cantilever pad with the recess 32. For instance, the through openings 33 may also be V-shaped or U-shaped.

The thickness of the cantilever pad 26 is any thickness that provides suitable structural support for the cantilever pad 26 when the package 10 is attached to another substrate or board, while also allowing some flexing of the cantilever pad 26. The cantilever pad 26 may allow flexing in one direction, such as into or away from the recess 32, or in two directions, such as both into and away from the recess 32.

The recess 32 may have a depth that is sufficient to provide adequate clearance in view of the flexing of the cantilever pad 26 into the recess 32 such that an upper surface of the cantilever pad 26 does not abut against the inner surface of the substrate 14 that delimits the recess 32.

The conductive fingers 20 are electrically coupled to conductive pads 28 of the cantilever pads 26 by one or more conductive traces 36 and through vias 38 that extend through the substrate 14. That is, the conductive fingers 20 are coupled to the trace 36 located above the first layer 17. The trace 36 on the first layer 17 is coupled to the trace 36 on the second layer 19 by through vias 38 that extend through the first and second layers 17, 19 of the substrate 14. In the illustrated embodiment, an inner trace 44 couples the through via 38 in the first layer 17 to the through via 38 in the second layer 19.

A dielectric material 46 is located over the traces 36 and on the first and second surfaces of the substrate 14. The dielectric material 46 may be any material that can provide protection from environmental sources of damage, such as corrosion, physical damage, moisture damage, or other causes of damage to electrical features. In one embodiment, the dielectric material 46 is a solder mask material. The solder mask may be a liquid material that hardens, such as during a curing process.

Encapsulation material 48 is located over the substrate, surrounding the die, the conductive fingers 20, and the conductive wires 22. The encapsulation material 48 may be any material configured to provide protection from environmental sources of damage, such as corrosion, physical damage, moisture damage, or other causes of damage to electrical devices. The encapsulation material 48 may be a molding compound that includes one or more of polymer, polyurethane, acrylic, epoxy resin, silicone, or any other suitable material.

FIG. 2 shows a portion of the package 10 coupled to a board, such as a printed circuit board (PCB) 50 by the conductive balls 31. As shown in FIG. 2, the cantilever pad 26 flexes into the recess 32. The cantilever pad 26 may be able to absorb stresses created in various materials or components of the package or components coupled to the package. In particular, the cantilever pad 26 can move into and/or away from the recess 26 in response to forces, such as those caused by thermal expansion of one or more components, thereby preventing or reducing the likelihood of cracks being formed in electrical components, such as conductive balls 31. Due to the flexibility of cantilever pad 26, the conductive joint reliability or solder joint reliability of the package 10 is improved.

The cantilever pad 26 may flex into the recess 32 during the mounting process in which the package 10 is mounted to the PCB 50 as well. For instance, due to nonplanar conductive balls 31 (e.g., standoff height differences of the conductive balls), some cantilever pads 26 may flex inward or outward from the recess. In some embodiments, pressure may be applied during mount, thereby placing a force on the cantilever pads 26 to move inward. Nonplanar conductive balls may be caused by dispensing different proportions of conductive material that form the balls or by warping of various components of the package.

The package 10 may include any number of cantilever pads 26. In one embodiment, all of the conductive pads of a package are cantilever pads 26. In other embodiments, only some of the conductive pads of a package are cantilever pads 26, while the other conductive pads are not cantilevered. In one embodiment, cantilever pads 26 are positioned on the package in locations that correspond to the largest amount of expected stress to be applied to the pad and conductive bump located on the pad.

Figure 3:
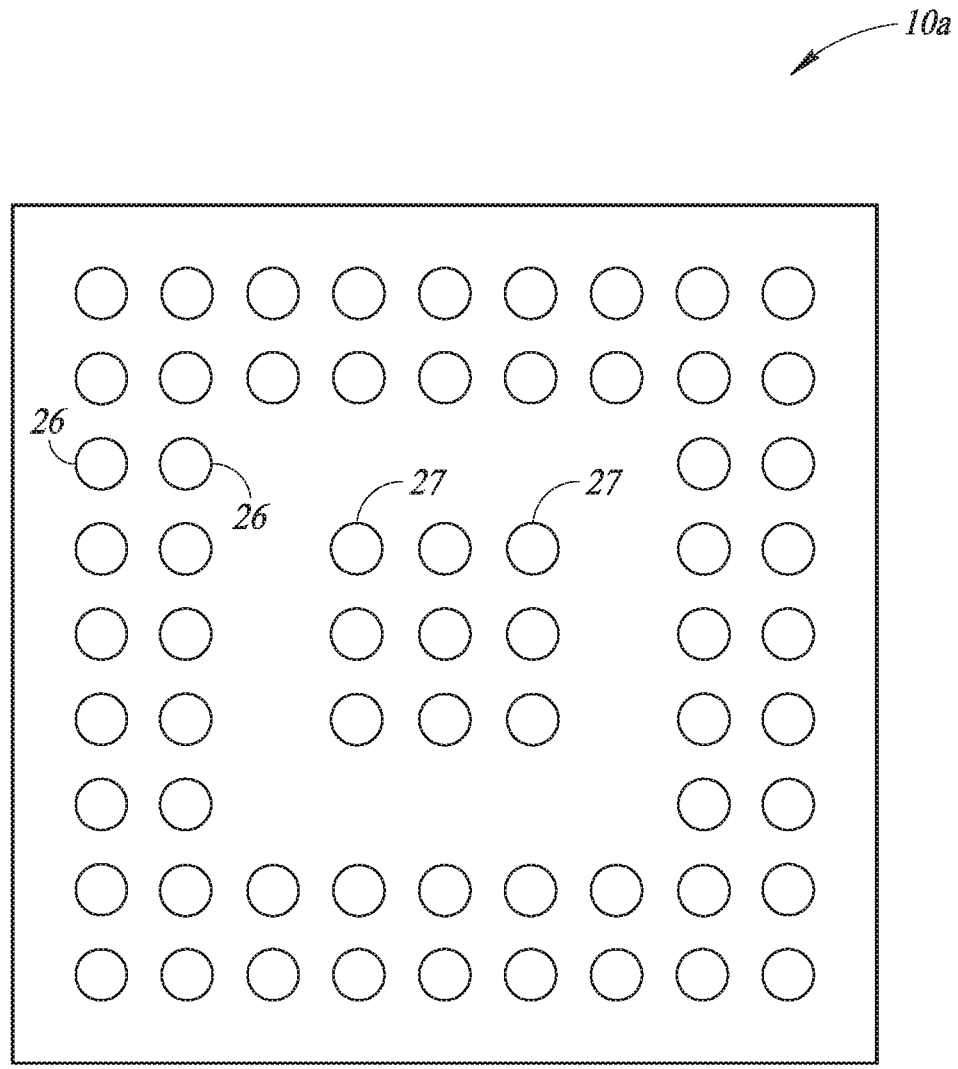
FIG. 3 illustrates a bottom surface of a package that includes some cantilever pads in accordance with one embodiment.

FIG. 3 illustrates a layout of a bottom surface of a package 10a that includes conductive balls 31 secured to cantilever pads 26 as described above and traditional pads 27 that are not cantilevered. That is, the cantilever pads 26 and conductive bump 31 are located at the perimeter of the package 10a, while the conductive pads 27 and conductive bump 31 at the center of the package 10a are traditional, non-cantilevered pads. In some embodiments, during thermal expansion, the conductive pads and bumps located at the perimeter of a package may be exposed to greater stresses than the central pads. In that regard, the cantilever pads 26 at an outer perimeter of the package are able to flex in response to stress induced therein, while the center pads are not exposed to substantial stresses.

Figure 4A:
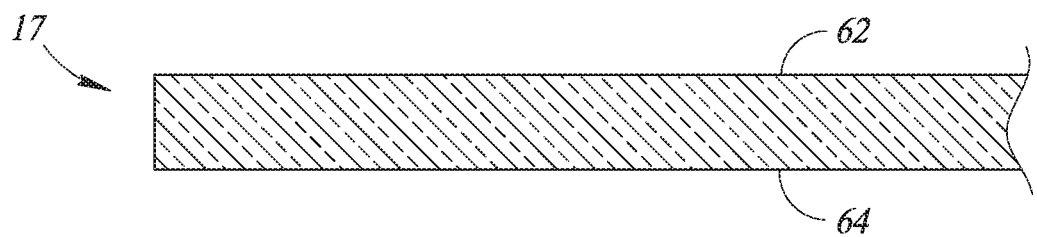
FIGS. 4A-4H illustrate cross-sectional views illustrating the packages of FIG. 1 being assembled in the close-up view of FIG. 1B at various stages of manufacture in accordance with one embodiment.

FIGS. 4A-4H illustrate cross-sectional views illustrating the package 10 of FIG. 1A being assembled in the close-up view of FIG. 1B at various stages of manufacture in accordance with one embodiment. FIG. 4A shows a first layer 17 of insulative core material which may be ceramic, glass, polymer, or any suitable core material. Although not shown, the first layer 17 may, in some embodiments, be coupled to a support structure during at least a portion of the processing. The first layer 17 of insulative material has a first surface 62 and a second surface 64.

Figure 4B:
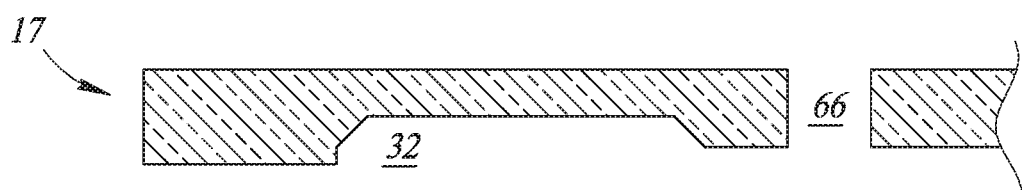

As shown in FIG. 4B, portions of the first layer 17 of the insulative material are removed. In particular, recesses 32 are formed in the second surface 64 of the first layer 17 and through holes 66 are formed that extend from the first surface 62 to the second surface 64. The recesses 32 correspond to locations for the cantilever pads 26 and the through holes 66 correspond to locations for the conductive through vias 38 of FIGS. 1A and 1B.

The recess 32 and through hole 66 are formed using standard semiconductor processing, including patterning the second surface using light sensitive material, such as photoresist and etching, such as wet and/or dry etching. Although only one recess and through hole are shown, it will be clear to persons of ordinary skill in the art that a plurality of recesses 32 and through holes 66 are formed in the second surface 64 of the first layer 17.

Figure 4C:
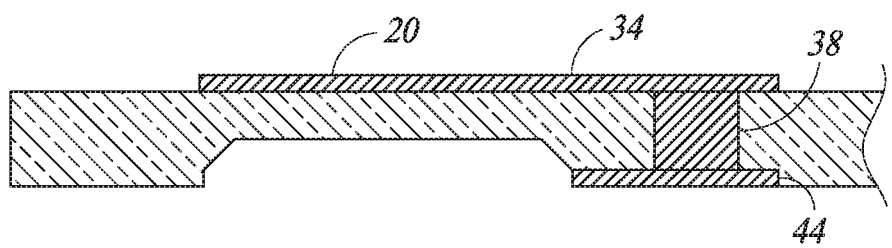

As shown in FIG. 4C, the through hole 66 is filled with a conductive material to form a conductive through via 38. Similarly, conductive material is deposited on the first and second surfaces 62, 64 of the first layer 17 above and below the conductive through vias 38 forming traces 36 and the conductive fingers 20. The deposition is performed using standard semiconductor processing techniques, which may include patterning the conductive material or blanket depositing the conductive material and then removing portions of the conductive material to form traces and conductive fingers. As mentioned above, the conductive material may be any conductive material, and in one embodiment is copper. In another embodiment the conductive material in the through via may be different from the conductive material forming the traces.

As shown in FIG. 3D, a second layer 19 of insulative material is secured to the second surface 64 of the first layer 17. The second layer 19 may be secured to the first layer 17 by any method, including by lamination, which may include pressure and/or heat. The thickness of the second layer 19 varies depending on the material properties used for the second layer 19 and may also depend on the mechanical properties of the conductive material that forms the trace 36 and conductive pad 28. In an embodiment, in which the second layer 19 is ceramic, the second layer 19 may be a thin film.

Figure 4D:
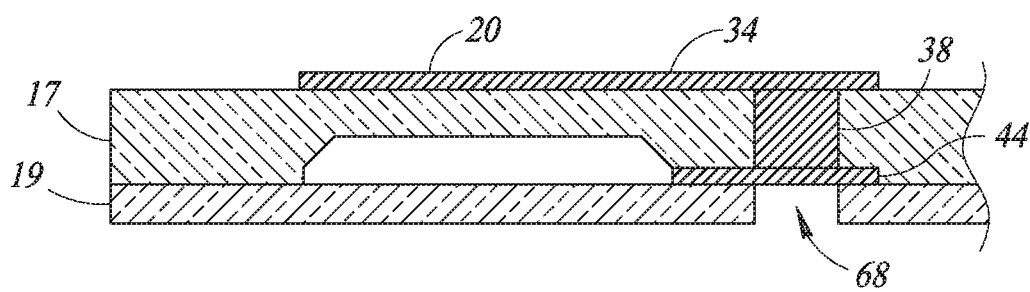

As shown in FIG. 4D, a through hole 68 is formed in the second layer 19 below the conductive through via 38 in the first layer 17. The through hole 68 is formed using standard processing techniques including patterning and etching as referenced above. The through hole 68 may be formed prior to securing the second layer 19 to the first layer 17 or after.

Figure 4E:
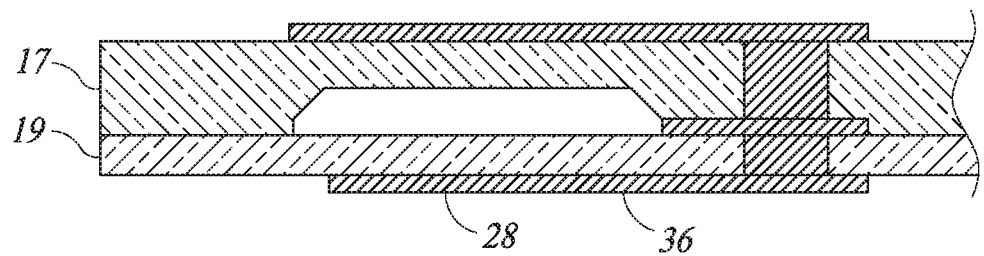

As shown in FIG. 4E, conductive material is deposited in the through hole 68 of the second layer 19 to form a conductive through via 38. The through via 38 of the second layer 19 is electrically coupled to the through via 38 of the first layer 17 by the inner trace 44. It is noted that the inner trace 44 extends laterally beyond the through vias 38. The inner trace 44 may resolve any misalignment issues that occur between the through via 38 of the first layer 17 and the through via 38 of the second layer 19 in view of the through holes 66 and 68 being etched in different processing steps.

As shown in FIG. 4E, a conductive material is deposited on the bottom surface of the second layer 19 to form trace 36 and conductive pad 28. The conductive material may be deposited and patterned using standard semiconductor techniques referenced above.

Figure 4F:
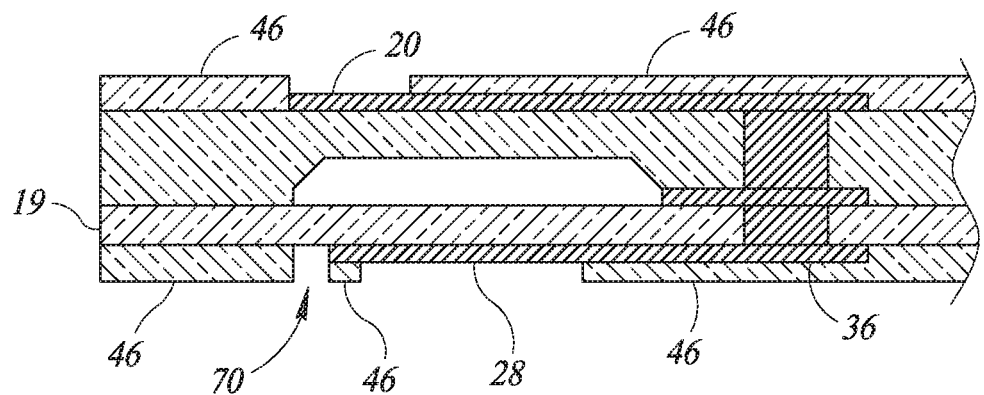

As shown in FIG. 4F, a dielectric layer 46 is deposited over portions of the first and second layers 17, 19 and various structures on the first and second layers 17 19, such as traces 36. The dielectric layer 46 is deposited by standard semiconductor processing techniques, including blanket deposition with patterning and etch or patterning light sensitive material then patterned deposition. As mentioned above, the dielectric layer 46 may be formed by depositing a liquid material that hardens. The liquid material may harden over time or may harden in a heating or curing step.

As shown in FIG. 4F, the conductive pad 28 on the second layer 19 remains exposed and conductive finger 20 on the first layer 17 remains exposed. Additionally, a portion 70 of the second layer 19 remains uncovered by the dielectric layer 46. The portion 70 is at least partially located below the recess 32.

The portion 70 that remains open has a shape that corresponds to the shape of the through opening 33 in FIG. 1C. As indicated above, the shape of the portion 70, however, may be any shape that when etched away causes a portion of the second layer 19 to form the cantilever pad 26 with the recess 32. Thus, the shape may be any two or three-sided shape, such as a C-shape, U-shape, V-shape, or any other suitable shape.

Figure 4G:
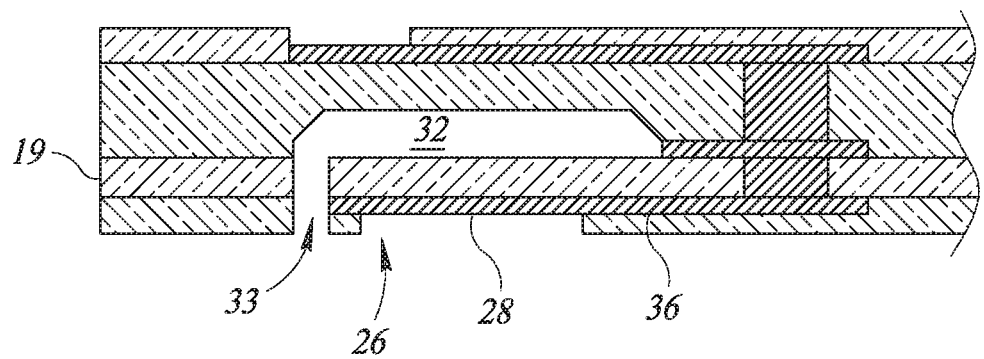

As shown in FIG. 4G, the portion 70 of the second layer 19 below the recess is removed, such as in a dry or wet etch step. In one embodiment, the dielectric material acts as an etch mask. Upon removal of the portion 70 of the second layer 19, the cantilever pad 26 is formed.

Figure 4H:
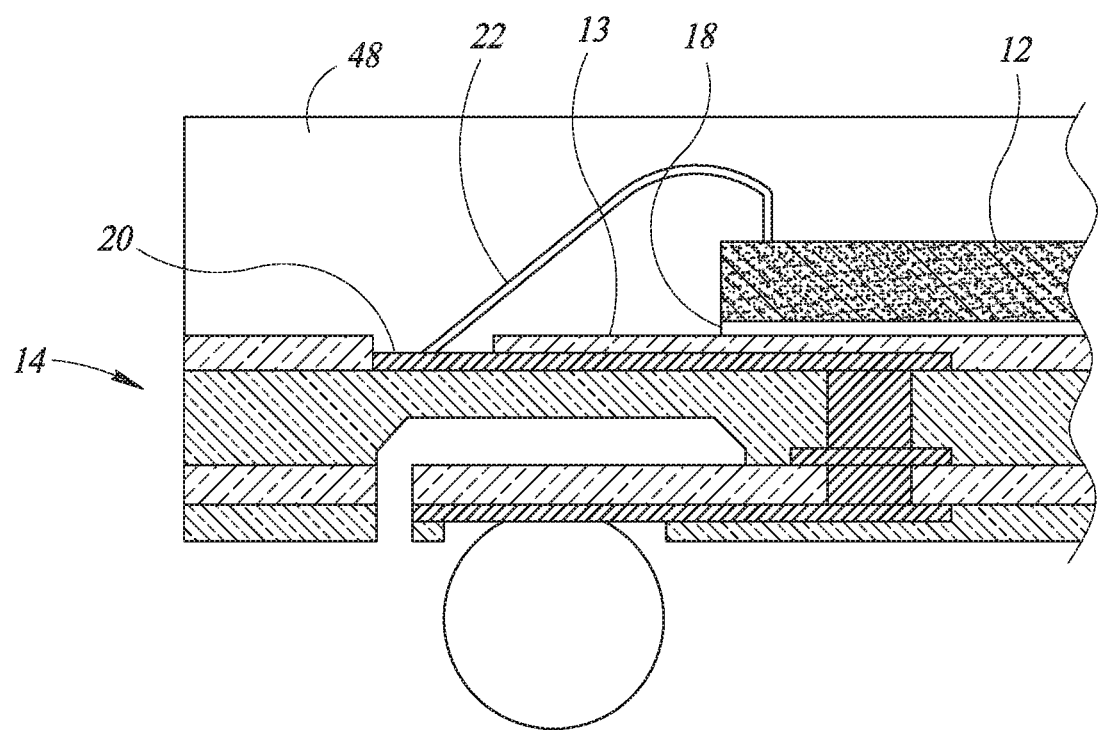

As shown in FIG. 4H, the semiconductor die 12 is coupled to the upper surface 13 of the substrate 14 by the adhesive material 18. That is, the adhesive material may be applied to one or both of the upper surface 13 and a back surface of the semiconductor die 12. The conductive wire 22 is coupled between the semiconductor die 12 and the conductive finger 20 as is well known in the art. An encapsulation material 48 is formed over the upper surface 13 of the substrate 14, encapsulating various components of the package. The encapsulation material may be formed using standard semiconductor processing techniques, including using a mold in which molding compound is injected therein and around the various components. The molding compound then hardens in a hardening step, which may include a curing or heat step. Conductive ball 31 may be formed on the cantilever pad 26, such as by solder dispensing techniques. In other embodiments, however, the conductive ball 31 is formed on another device to which the package 10 will be coupled.

It is to be understood that the method steps can be performed in any order and thus may be in a different order than is shown and described. For instance, the through opening 33 may be formed in the second layer 19 before coupling the first and second layers 17, 19 together.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a recess in a first surface of a first layer of insulative material;
   covering the recess with a second layer of insulative material, a layer of conductive material located on the second layer of insulative material and extending over a portion of the recess;

forming a through hole in the second layer of insulative material to form a cantilever portion, the cantilever portion including the second layer of insulative material and the conductive material, wherein the conductive material on the cantilever portion is a cantilever bond pad located over the recess, wherein a dielectric layer is located over a portion of the conductive material, wherein the dielectric layer includes a through opening exposing the conductive material to form the cantilever bond pad;

coupling a semiconductor die to a second surface of the first layer and electrically coupling the semiconductor die to the cantilever bond pad; and encapsulating the semiconductor die to form a semiconductor package.

2. The method of claim 1, further comprising forming a conductive ball on the cantilever bond pad.

3. The method of claim 1, further comprising forming a conductive through via through the first and second layers, the conductive through via being electrically coupled to the cantilever bond pad.

4. The method of claim 3 wherein the conductive through via is coupled to a pad on a second surface of the first layer, the second surface being opposite the first surface, the pad being electrically coupled to the cantilever bond pad.

5. The method of claim 4, wherein the pad on the second surface of the first layer is coupled to a bond pad of the semiconductor die.

6. The method of claim 1 wherein forming the through hole comprises forming a U-shaped, C-shaped, or V-shaped through hole around the layer of conductive material extending over the portion of the recess.

7. The method of claim 1, wherein the dielectric material covers the conductive material that forms a trace coupled to the cantilever bond pad.

8. A method, comprising:
forming a recess in a first surface of a substrate that includes a first layer of insulative material;
forming a second layer of insulative material and a layer of conductive material over the recess and on the first layer of insulative material;
forming a dielectric layer over the second layer of insulative material and the layer of conductive material, wherein the dielectric layer includes a first opening and a second opening, the first opening exposing the second layer of insulative material, the second opening exposing layer of conductive material;
forming a through hole in the second layer of insulative material at the first opening in the dielectric layer and at the recess in the first surface of the substrate to form a cantilevered bond pad at the second opening, the cantilevered bond pad being over the recess and configured to flex into the recess;
coupling a semiconductor die to a second surface of the substrate, the second surface being opposite the first surface;
electrically coupling the semiconductor die to the cantilevered bond pad; and
encapsulating the semiconductor die to form a semiconductor package.

9. The method of claim 8 wherein electrically coupling the semiconductor die to the cantilevered bond pad includes coupling a first end of a wire to a bond pad of the semiconductor die and coupling a second end of the wire to a pad on a second surface of the substrate, wherein the pad on the second surface of the substrate is coupled to the cantilevered bond pad by a conductive through via in the substrate.

10. The method of claim 8 wherein forming the through hole comprises forming a through hole that is U, C, or V shaped.

11. The method of claim 8 wherein forming the recess in the first surface of the substrate comprises forming a plurality of recesses in the first surface of the substrate, and wherein partially covering comprises partially covering the plurality of recesses with cantilevered bond pads, respectively.

12. The method of claim 8, further comprising attaching a solder ball to the cantilevered bond pad.

13. A method, comprising:
forming a recess in a first surface of a first layer of insulative material;
coupling the first layer and a second layer of insulating material together, the second layer covering the recess;
forming a conductive material on the second layer, the conductive material located over a portion of the recess;
forming a dielectric layer over the conductive material, wherein forming the dielectric layer includes forming a first through opening and a second through opening, the first through opening exposing the second layer of insulative material, the second through opening exposing the conductive material to form a conductive bond pad;
forming a through hole in the second layer of insulative material at the second through opening of the dielectric layer, the through hole of the second layer being in fluid communication with the recess, wherein forming the through hole in the second layer of insulative material releases the conductive bond pad and a portion of the second layer of insulative material to form a cantilever bond pad, a portion of the conductive material deposited on the second layer forming the cantilever bond pad, the cantilever bond pad being configured to flex toward the recess;
securing a semiconductor die to the first surface of the first layer;
electrically coupling the semiconductor die to the conductive material on the second layer and on the cantilever bond pad; and
forming a semiconductor package.

14. The method of claim 13 wherein coupling the first and second layers together comprises laminating the first and second layers together.

15. The method of claim 13 wherein forming the through hole in the second layer occurs after coupling the first and second layers together.

16. The method of claim 13 wherein forming the through hole comprises forming a U-shaped, C-shaped, or V-shaped through hole.

17. The method of claim 13, wherein securing the semiconductor die to the first surface of the first layer occurs after forming the through hole in the second layer of insulative material.

18. The method of claim 13 wherein forming the recess comprises forming a plurality of recesses and forming the through hole comprises forming a plurality of through holes.

19. The method of claim 13 wherein the dielectric layer is formed over a trace coupled to the cantilever bond pad.

* * * * *